(12) United States Patent
Sakurai et al.

(10) Patent No.: US 6,770,820 B2
(45) Date of Patent: Aug. 3, 2004

(54) SHIELDED FLAT CABLE

(75) Inventors: Ryo Sakurai, Tokyo (JP); Hidetoshi Hiraoka, Tokyo (JP); Tokuo Okada, Tokyo (JP); Yasuhiro Morimura, Tokyo (JP); Teruo Miura, Tokyo (JP)

(73) Assignee: Kabushiki Kaisha Bridgestone, Tokyo (JP)

( * ) Notice: Subject to any disclaimer, the term of this patent is extended or adjusted under 35 U.S.C. 154(b) by 0 days.

(21) Appl. No.: 10/070,736

(22) PCT Filed: Jul. 11, 2001

(86) PCT No.: PCT/JP01/05992

§ 371 (c)(1),
(2), (4) Date: Mar. 12, 2002

(87) PCT Pub. No.: WO02/05297

PCT Pub. Date: Jan. 17, 2002

(65) Prior Publication Data

US 2002/0189847 A1 Dec. 19, 2002

(30) Foreign Application Priority Data

Jul. 12, 2000 (JP) .................................... 2000-211889
Jul. 12, 2000 (JP) .................................... 2000-211890
Jul. 12, 2000 (JP) .................................... 2000-211891

(51) Int. Cl.$^7$ ............................................. H01B 7/08
(52) U.S. Cl. ........................... 174/117 F; 174/117 A
(58) Field of Search ................... 174/117 F, 117 FF, 174/36

(56) References Cited

U.S. PATENT DOCUMENTS 3,926,918 A * 12/1975 Shibata et al. ............... 525/61
4,209,215 A * 6/1980 Verma ......................... 439/497
5,003,126 A * 3/1991 Fujii et al. ..................... 174/36
5,250,127 A * 10/1993 Hara ............................ 156/52
5,455,383 A * 10/1995 Tanaka ......................... 174/36
6,027,802 A * 2/2000 Lin ............................. 428/343
6,255,778 B1 * 7/2001 Yoshikawa et al. ......... 313/582

FOREIGN PATENT DOCUMENTS

| JP | 4-33211 | * | 2/1992 |
| JP | 5-342918 | * | 12/1993 |
| JP | 7-94036 | | 4/1995 |
| JP | 8-7664 | * | 1/1996 |
| JP | 10-251606 | * | 9/1998 |
| JP | 11-120831 | | 4/1999 |

* cited by examiner

*Primary Examiner*—Chau N. Nguyen
(74) *Attorney, Agent, or Firm*—Sughrue Mion, PLLC (57) ABSTRACT

By using a conductive adhesive prepared by dispersing conductive particles such as a nickel filler in a thermally or optically curable adhesive comprising a base resin having heat resistance and flexibility after curing, such as EVA, PVB, acrylic resin or unsaturated polyester, as an adhesive for making the shielding conductive layer of a shielded flat cable conductive with the ground line of a cable body in a non-insulated portion and bonding the cable body to the shielding member, the heat resistance and connection reliability in a high temperature and high humidity condition of the shielded flat cable are ensured.

To further improve adhesion, a phosphoric acid methacrylate and melamine-based resin are blended with the above base resin.

53 Claims, 3 Drawing Sheets

SHIELDED FLAT CABLE

BACKGROUND OF THE INVENTION

1. Field of the Invention

The present invention relates to a flat cable for connecting a plurality of circuits or devices such as computers and communication devices and, particularly, to a shielded flat cable having a shielding layer which is made conductive with an earth cable.

2. Description of the Prior Art

Figures 3A, 3B:
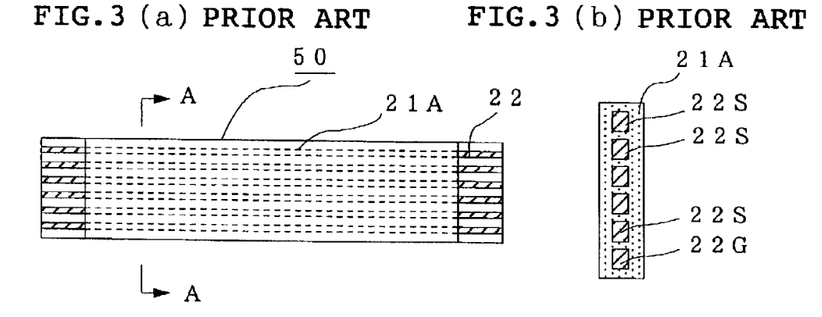
FIGS. 3(a) and 3(b) are diagrams showing the constitution of a flat cable of the prior art.

In recent years, a flat cable 50 shown in FIGS. 3(a) and 3(b) has been frequently used as a connection cable for connecting devices such as computers and communication devices in place of a coaxial cable. This flat cable 50 is produced by sheathing a plurality of conductors 22 disposed in parallel to one another with an insulating member 21A except both end portions thereof, and the conductors 22 consist of a large number of signal lines 22S and at least one ground line 22G.

As is already known, a coaxial cable has excellent electromagnetic wave shielding properties as a ground line surrounds signal lines. However, in the case of the above flat cable 50, as the signal lines 22S and the ground line 22G are arranged in parallel to one another, noise is readily superimposed on the above signal lines 22S.

Figures 4A, 4B:
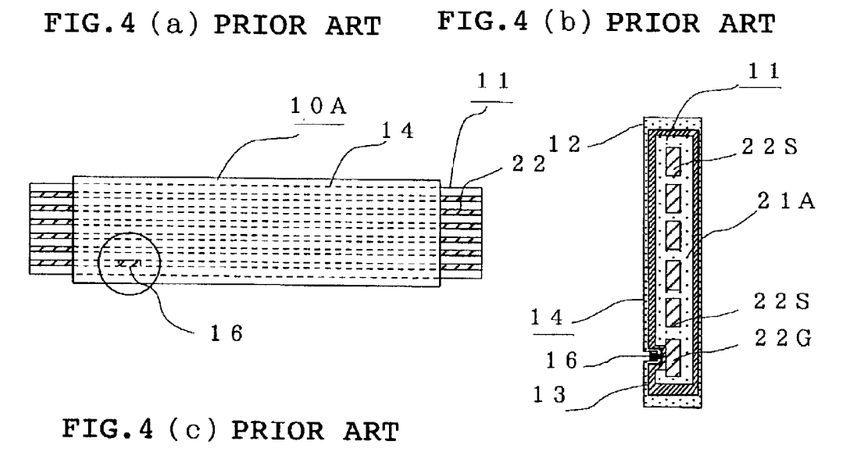
FIGS. 4(a), 4(b) and 4(c) are diagrams showing the constitution of another shielded flat cable of the prior art.
Figure 4C:
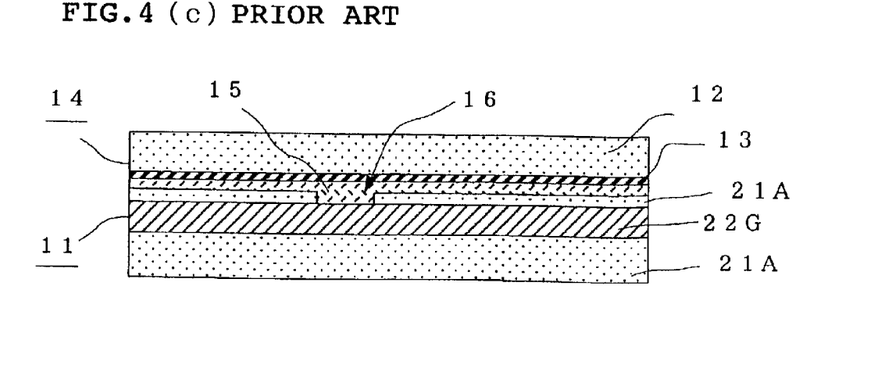

As a flat cable used for connecting computers and communication devices which require resistance to noise, a shielded flat cable 10A comprising an electromagnetic wave shielding layer 13 for preventing malfunctioning caused by the above noise as shown in FIGS. 4(a) to 4(c) is widely used. This shielded flat cable 10A is produced by sheathing the same cable body 11 as that of the above flat cable 50 with a film-like shielding member 14 having a shielding layer 13 made of a metal film formed on one side of an insulating substrate 12 in order to protect the above plurality of conductors 22 from an electromagnetic wave. The above cable body 11 and the shielding member 14 are bonded together by a conductive adhesive. A non-insulating portion 16 devoid of the above insulating member 21A is formed on part of the above ground line 22G, and the above shielding layer 13 and the above ground line 22G are made conductive with each other by the above conductive adhesive constituting an adhesive layer 15 in the above non-insulating portion 16. Therefore, external noise is caused to flow from the above shielding layer 13 to the ground (earth) of a device body through the above ground line 22G, thereby making it possible to ensure the electromagnetic wave shielding properties of the flat cable 10A.

As the above conductive adhesive, there is disclosed a conductive adhesive prepared by dispersing silver particles or copper particles as a conductive material in an adhesive resin essentially composed of a thermoplastic resin having heat-sealing properties, such as polyethylene, polyester or polyamide (Japanese Laid-open Patent Application No. 7-94036). However, when silver particles are used, the cost is boosted though excellent conductivity is obtained. When copper particles are used, electromagnetic wave shielding properties deteriorate along the passage of time.

As means of solving the above problems, there is proposed a method of obtaining stable electromagnetic wave shielding properties at a low cost by using an adhesive comprising a nickel filler in place of silver particles or copper particles (Japanese Laid-open Patent Application No. 11-120831).

The conductor pattern of the cable body 11 is becoming finer and finer along with the downsizing of a device, thereby increasing the resistance values of the above conductors 22 and generating heat easily with the result that the heat resistance requirement for the shielded flat cable 10A is becoming higher and higher. Further, the shielded flat cable 10A is required to improve adhesion between the cable body 11 and the shielding member 14 in order to ensure connection reliability in a high-temperature and high-humidity condition in addition to the above heat resistance.

However, as the conductive adhesive used in the adhesive layer 15 of the above conventional shielded flat cable 10A is an adhesive resin essentially composed of a thermoplastic resin, it has problems with heat resistance and the reliability of connection strength in a high-temperature and high-humidity condition.

It is an object of the present invention which has been made in view of the above problems of the prior art to provide a shielded flat cable which has excellent heat resistance and can ensure connection reliability even in a high-temperature and high-humidity condition.

SUMMARY OF THE INVENTION

According to a first aspect of the present invention, there is provided a shielded flat cable comprising a cable body in which a plurality of conductors including at least one ground line is covered except at least part of the ground line with an insulating member, a shielding member having a shielding layer made of a conductive material formed on one side of an insulating substrate for sheathing the cable body, and an adhesive layer comprising an adhesive with conductive particles dispersed therein, part of the adhesive layer being in contact with a non-covered portion of the ground line for bonding the shielding member to the cable body, wherein the adhesive is a thermally or optically curable adhesive comprising a resin having heat resistance and flexibility after curing as a base resin.

According to a second aspect of the present invention, there is provided a shielded flat cable, wherein the resin is an ethylene-vinyl acetate copolymer or a copolymer of a monomer and at least one of ethylene and vinyl acetate.

According to a third aspect of the present invention, there is provided a shielded flat cable, wherein the resin is a polymer obtained by acetalizing a polyvinyl alcohol.

According to a fourth aspect of the present invention, there is provided a shielded flat cable, wherein the content of the acetal group in the polymer is 30 mol % or more.

According to a fifth aspect of the present invention, there is provided a shielded flat cable, wherein the resin is a polymer obtained by acetalizing a polyvinyl alcohol, or an acrylic resin obtained by polymerizing at least one of an acrylic monomer and a methacrylic monomer.

According to a sixth aspect of the present invention, there is provided a shielded flat cable, wherein the resin is a polyester unsaturated compound soluble in a solvent.

According to a seventh aspect of the present invention, there is provided a shielded flat cable, wherein the base resin is mixed with a phosphoric acid methacrylate and melamine-based resin.

According to an eighth aspect of the present invention, there is provided a shielded flat cable, wherein the phosphoric acid methacrylate is used in an amount of 0.1 to 60 parts by weight and the melamine-based resin is used in an amount of 0.1 to 200 parts by weight based on 100 parts by weight of the base resin.

According to a ninth aspect of the present invention, there is provided a shielded flat cable, wherein the phosphoric acid methacrylate is one or more of 2-methacryloyloxyethyl acid phosphate and diphenyl-2-methacryloyloxyethyl phosphate.

According to a tenth aspect of the present invention, there is provided a shielded flat cable, wherein the melamine-based resin is one or more of melamine resin, isobutylated melamine resin, butylated melamine resin and methylated melamine resin.

According to an eleventh aspect of the present invention, there is provided a shielded flat cable, wherein the adhesive comprises an organic peroxide or optical sensitizer in an amount of 0.1 to 10 parts by weight based on 100 parts by weight of the base resin.

According to a twelfth aspect of the present invention, there is provided a shielded flat cable, wherein the adhesive comprises at least one reactive compound selected from the group consisting of an acryloxy group-containing compound and methacryloxy group-containing compound in an amount of 0.5 to 80 parts by weight based on 100 parts by weight of the base resin.

According to a thirteenth aspect of the present invention, there is provided a shielded flat cable, wherein the adhesive comprises a silane coupling agent in an amount of 0.01 to 5 parts by weight based on 100 parts by weight of the base resin.

According to a fourteenth aspect of the present invention, there is provided a shielded flat cable, wherein the adhesive comprises a hydrocarbon resin in an amount of 1 to 200 parts by weight based on 100 parts by weight of the base resin.

According to a fifteenth aspect of the present invention, there is provided a shielded flat cable, wherein the amount of the conductive particles is 1 to 70 parts by weight based on 100 parts by weight of the base resin.

According to a sixteenth aspect of the present invention, there is provided a shielded flat cable, wherein the average particle diameter of the conductive particles is 0.1 to 100 µm.

According to a seventeenth aspect of the present invention, there is provided a shielded flat cable, wherein a metal filler is used as the conductive particles.

According to an eighteenth aspect of the present invention, there is provided a shielded flat cable, wherein nickel powders are used as the metal filler.

According to a nineteenth aspect of the present invention, there is provided a shielded flat cable, wherein a flame retardant film is used as the substrate of the shielding member.

Other objects, advantages and features of the present invention will become apparent from the following description when taken in conjunction with the accompanying drawings.

DETAILED DESCRIPTION OF THE PREFERRED EMBODIMENTS

Preferred embodiments of the present invention will be described hereinbelow with reference to the accompanying drawings.

Figure 1A:
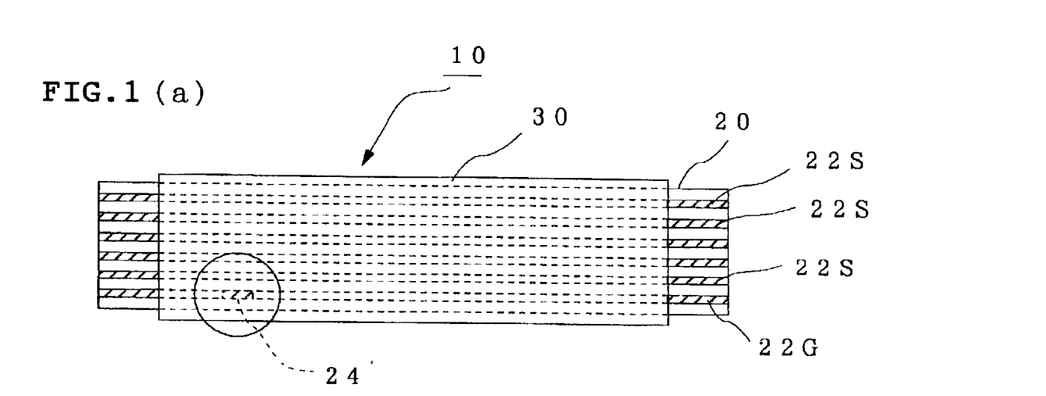
FIGS. 1(a) and 1(b) are diagrams showing the constitution of a shielded flat cable according to the best mode of the present invention.
Figure 1B:
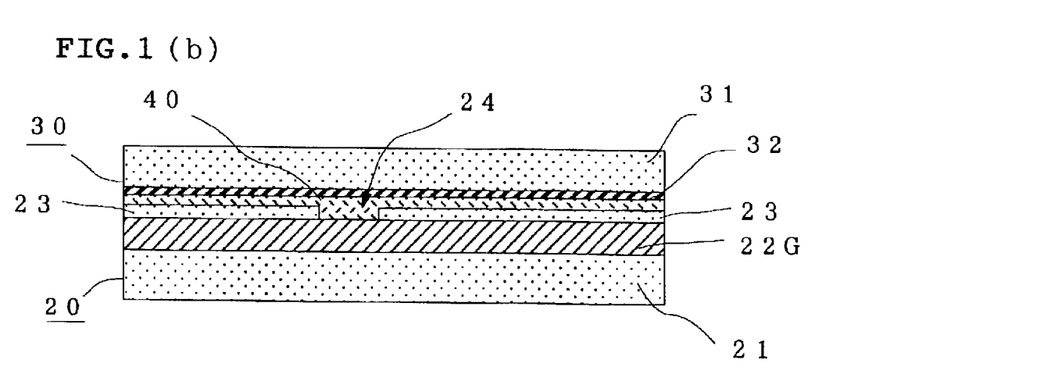

FIGS. 1(a) and 1(b) are diagrams showing the constitution of a shielded flat cable 10 according to the best mode of the present invention. FIG. 1(a) is a plan view and FIG. 1(b) is a sectional view of an essential section near a ground line 22G. In these figures, reference numeral 20 denotes a cable body comprising an insulating substrate 21, a plurality of conductors 22 made of a metal film such as a copper film formed on the above substrate 21 and an insulating protective layer 23 for covering the above conductors 22 except both end portions thereof which are connection terminals with another circuit. The above substrate 21 and the above insulating protective layer 23 are made from a synthetic resin having excellent flame retardancy and heat resistance, such as polyimide or polyethylene terephthalate (PET). The above conductors 22 consist of a plurality of signal lines 22S and one ground line 22G which are disposed in parallel to one another and a non-insulating portion 24 devoid of the above insulating protective layer 23 is formed on part of the ground line 22G.

Reference numeral 30 denotes a shielding member comprising an insulating substrate 31 made from the same synthetic resin having excellent flame retardancy and heat resistance as the above substrate 21 and a shielding conductive layer 32 made of a copper thin film formed on one side of the above substrate 31 by deposition or the like.

Reference numeral 40 represents an adhesive layer made from a conductive adhesive for bonding the above cable body 20 to the shielding member 30, and the above shielding conductive layer 32 and the ground line 22G are made conductive with each other by the above adhesive layer 40 in the above non-insulating portion 24.

Although the above conductive adhesive is generally prepared by dispersing conductive particles in an adhesive resin essentially composed of a thermoplastic resin, according to the best mode of the present invention, a thermosetting adhesive which is composed of a resin composition comprising a resin having heat resistance and flexibility after curing as the main component and an organic peroxide as a thermal curing agent is used as the above adhesive resin.

As the resin having heat resistance and flexibility after curing as the base resin of the above thermosetting adhesive may be used an ethylene-vinyl acetate copolymer (EVA). The content of vinyl acetate in the above ethylene-vinyl acetate copolymer (EVA) is preferably 10 to 60 wt %, more preferably 15 to 45 wt % to secure a sufficiently high crosslinking degree and ensure that the softening temperature of the resin should not fall below the upper limit of the use temperature range of the cable.

As the above resin may be used a copolymer of a monomer and at least one of ethylene and vinyl acetate. For example, when a copolymer of ethylene, vinyl acetate and an acrylate-based and/or methacrylate-based monomer is used, the content of vinyl acetate in the above copolymer is preferably 10 to 50 wt %, more preferably 15 to 45 wt %. The content of the above monomer is 0.01 to 10 wt %, preferably 0.05 to 5 wt %.

The above resin may be a copolymer of ethylene, maleic acid and/or maleic anhydride, or a copolymer of ethylene, acrylate-based and/or methacrylate-based monomer and maleic acid and/or maleic anhydride.

Or the above resin may be a polymer (polyvinyl acetal) obtained by acetalizing a polyvinyl alcohol comprising 30 mol % or more of an acetal group, such as polyvinyl formal or polyvinyl butyral (PVB).

Further, the above resin may be a polymer obtained by acetalizing the above polyvinyl alcohol, or an acrylic resin obtained by polymerizing at least one of an acrylic monomer and a methacrylic monomer.

The above resin may be a polyester unsaturated compound soluble in a solvent.

The above polyester unsaturated compound soluble in a solvent is preferably a radical reaction curable polyester unsaturated compound such as an unsaturated polyester obtained by reacting a polybasic acid with a polyhydric alcohol or a compound obtained by introducing a (meth) acryloxy group into a saturated copolyester soluble in a solvent. The above solvent is an organic solvent such as acetone, methyl ethyl ketone (MEK) or ethyl acetate.

In the present invention, it is preferred to blend a phosphoric acid methacrylate and melamine-based resin with a resin (to be referred to as "base resin" hereinafter) which is the main component of the above adhesive so as to improve adhesion. Thereby, adhesion to a resin such as polyimide or polyethylene terephthalate used in the substrate 21 and insulating layer 23 of the cable body 20 and the substrate 31 of the shielding member 30 and to a metal thin film such as a copper thin film used as the shielding conductive layer 32 can be enhanced, thereby further improving the connection reliability of the shielded flat cable 10.

The above phosphoric acid methacrylate may be one or more of 2-methacryloyloxyethyl acid phosphate and diphenyl-2-methacryloyloxyethyl phosphate. The phosphoric acid methacrylate is used in an amount of preferably 0.1 to 60 parts by weight, more preferably 0.5 to 40 parts by weight based on 100 parts by weight of the above base resin. When the amount of the phosphoric acid methacrylate is smaller than 0.1 part by weight, a satisfactory adhesion improving effect cannot be obtained and when the amount is larger than 60 parts by weight, connection reliability deteriorates.

The above melamine-based resin is one or more of melamine resin, butylated melamine resins such as isobutylated melamine resin and n-butylated melamine resin, and methylated melamine resin.

The above melamine-based resin is used in an amount of preferably 0.1 to 200 parts by weight, particularly preferably 0.5 to 100 parts by weight based on 100 parts by weigh of the above base resin. When the amount of the melamine-based resin is smaller than 0.1 part by weight, a satisfactory adhesion improving effect cannot be obtained and when the amount is larger than 200 parts by weight, connection reliability deteriorates.

Any organic peroxide may be used as a thermal curing agent if it decomposes at a temperature of 70° C. or more to generate a radical but an organic peroxide having a decomposition temperature at a half life of 10 hours of 50° C. or more is preferred. However, the organic peroxide is selected in consideration of heating temperature, control conditions, the heat resistance of an adherend, storage stability and the like.

Examples of the usable organic peroxide include 2,5-dimethylhexane-2,5-dihydroperoxide, 2,5-dimethyl-2,5-di (t-butylperoxy)hexane-3, di-t-butyl peroxide, t-butylcumyl peroxide, 2,5-dimethyl-2,5-di(t-butylperoxy)hexane, dicumyl peroxide, α,α'-bis(t-butylperoxyisopropyl) benzene, n-butyl-4,4-bis(t-butylperoxy)valerate, 1,1-bis(t-butylperoxy)cyclohexane, 1,1-bis(t-butylperoxy)-3,3,5-trimethylcyclohexane, t-butylperoxy benzoate, benzoyl peroxide, t-butylperoxy acetate, methyl ethyl ketone peroxide, 2,5-dimethylhexyl-2,5-bisperoxy benzoate, butylhydroperoxide, p-menthanehydroperoxide, p-chlorobenzoyl peroxide, hydroxybutyl peroxide, chlorohexanone peroxide, octanoyl peroxide, decanoyl peroxide, lauroyl peroxide, cumylperoxy octoate, succinic acid peroxide, acetyl peroxide, t-butylperoxy(2-ethylhexanoate) m-toluylperoxide, t-butylperoxy isobutyrate and 2,4-dichlorobenzoyl peroxide. These organic peroxides may be used alone or in combination of two or more.

The organic peroxide is preferably used in an amount of 0.1 to 10 parts by weight based on 100 parts by weight of the above base resin.

In order to improve or adjust the physical properties (such as mechanical strength, adhesion, heat resistance and moisture-resistant crosslinking rate) of a thermosetting adhesive which is composed of a resin composition comprising the above base resin and a thermal curing agent, the above resin composition is preferably blended with a reactive compound (monomer) having an acryloxy group, methacryloxy group or epoxy group. The reactive compound is an acrylic acid or methacrylic acid derivative, for example, an ester or amide thereof in most cases. Examples of the residual group contained in the ester include alkyl groups such as methyl, ethyl, dodecyl, stearyl and lauryl, and cyclohexyl, tetrahydrofurfuryl, aminoethyl, 2-hydroxyethyl, 3-hydroxypropyl and 3-chloro-2-hydroxypropyl groups. Esters of polyfunctional alcohols such as ethylene glycol, triethylene glycol, polypropylene glycol, polyethylene glycol, trimethylolpropane and pentaerythritol may also be used. The amide is typically diacetone acrylamide. Examples of the polyfunctional crosslinking aid include acrylic acid and methacrylic acid esters such as trimethylolpropane, pentaerythritol and glycerin. Examples of the epoxy group-containing compound include triglycidyl tris (2-hydroxyethyl) isocyanurate, neopentyl glycol diglycidyl ether, 1,6-hexanediol diglycidyl ether, allylglycidyl ether, 2-ethylhexyl glycidyl ether, phenylglycidyl ether, phenol $(EO)_6$ glycidyl ether, p-t-butylphenyl glycidyl ether, diglycidyl adipate, diglycidyl phthalate, glycidyl methacrylate and butyl glycidyl ether. The same effect is obtained by alloying a polymer containing an epoxy group.

These reactive compounds are used alone or as a mixture of two or more in an amount of 0.5 to 80 parts by weight, preferably 0.5 to 70 parts by weight based on 100 parts by weight of the above base resin. When the amount is larger than 80 parts by weight, the work efficiency at the time of preparing an adhesive and film formability may deteriorate.

In the present invention, a silane coupling agent is preferably added as an adhesion promoting agent. Examples of the silane coupling agent include vinyl triethoxysilane, vinyl tris(β-methoxyethoxy)silane, γ-methacryloxypropyl trimethoxysilane, vinyl triacetoxysilane, γ-glycidoxypropyl trimethoxysilane, γ-glycidoxypropyl triethoxysilane, β-(3,4-epoxycyclohexyl)ethyl trimethoxysilane, vinyl trichlorosilane, γ-mercaptopropyl trimethoxysilane, γ-aminopropyl trimethoxysilane and N-β-(aminoethyl)-γ-aminopropyl trimethoxysilane. They may be used alone or as a mixture of two or more.

The amount of the silane coupling agent is generally 0.01 to 5 parts by weight based on 100 parts by weight of the above base resin.

In the present invention, a hydrocarbon resin may be further added to improve processability and lamination properties. In this case, the hydrocarbon resin to be added may be either a natural resin or synthetic resin. Preferred examples of the natural resin include rosin, rosin derivatives and terpene-based resins. Examples of the rosin include rubber-based resins, tall oil-based resins and wood-based resins. The rosin derivatives are obtained by hydrogenating, disproportionating, polymerizing, esterifying and metal chlorinating rosin. The terpene-based resins include terpene-based resins such as α-pinene and β-pinene, and terpene phenol resins. Other natural resins include dammar, covar and shellac. Preferred examples of the synthetic resin include petroleum-based resins, phenolic resins and xylene-based resins. The petroleum-based resins include aliphatic petroleum resins, aromatic petroleum resins, alicyclic petroleum resins, copolymer-based petroleum resins, hydrogenated petroleum resins, pure monomer-based petroleum resins and coumaroneindene resins. The phenolic resins include alkyl phenolic resins and modified phenolic resins. The xylene-based resins include xylene resin and modified xylene resins.

The amount of the hydrocarbon resin is suitably selected but preferably 1 to 200 parts by weight, more preferably 5 to 100 parts by weight based on 100 parts by weight of the above base resin.

An anti-aging agent, dye and processing aid may be used in limits not prejudicial to the object of the present invention in addition to the above additives.

Various conductive particles may be used as the conductive particles if they are satisfactory electric conductors. Metals such as copper, silver and nickel, alloy powders thereof, and resins and ceramic powders coated with the above metals or alloys thereof may be used. By using a nickel filler out of them, stable electromagnetic wave shielding properties can be ensured at a low cost. The above nickel filler may be plated with gold before use. The shape of the conductive particles is not particularly limited and may be flaky, branched, granular, pellet or the like.

The amount of the conductive particles is preferably 1 to 70 parts by weight, more preferably 3 to 50 parts by weight based on 100 parts by weight of the above base resin. The average particle diameter of the conductive particles is 0.1 to 100 μm, preferably 3 to 100 μm, more preferably 5 to 80 μm.

Figure 2A:
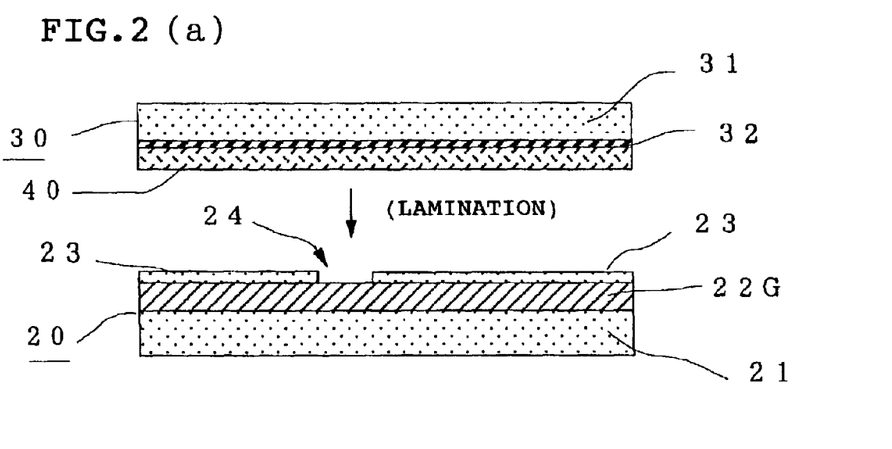
FIGS. 2(a) and 2(b) are diagrams showing the method of producing a shielded flat cable according to the best mode of the present invention.
Figure 2B:
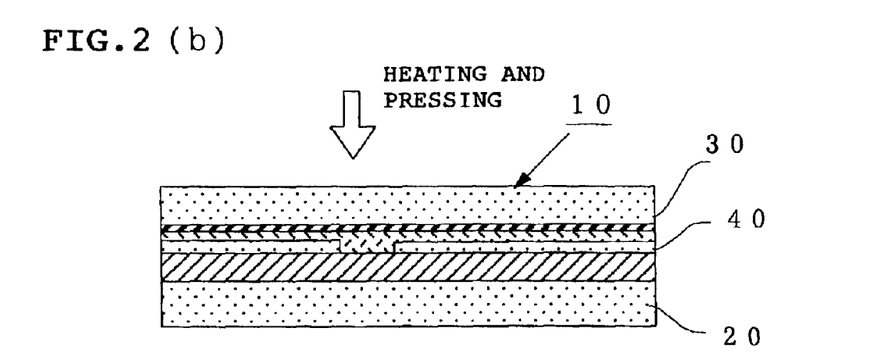

As shown in FIGS. 2(a) and 2(b), the shielded flat cable 10 having the above constitution is produced by forming a conductive adhesive layer 40 comprising conductive particles such as a nickel filler in the above thermosetting adhesive on the shielding conductive layer 32 of the shielding member 30, joining together the above shielding member 30 and the cable body 20 in such a manner that this adhesive layer 40 and the non-insulating portion 24 formed side of the cable body 20 are opposed to each other, and heating and pressing the obtained laminate. As for thermal curing conditions which depend on the types and amounts of the additives such as an organic peroxide, the heating temperature is generally 70 to 170° C., preferably 70 to 150° C. and the pressure is generally 3 MPa, particularly preferably 2 to 3 MPa. The heating time is generally 10 seconds to 120 minutes, preferably 20 seconds to 60 minutes.

Since the above adhesive layer 40 is formed by pressing in the thickness direction of the layer as described above, it has the characteristic properties of a so-called anisotropic conductive film which is provided with conductivity in the thickness direction.

That is, the conductive adhesive used in the present invention and obtained by dispersing conductive particles in a thermosetting adhesive comprising a resin such as EVA, PVB, acrylic resin or unsaturated polyester as a base resin has the following excellent characteristic properties.

1) It has excellent moisture resistance and heat resistance, exhibits the characteristic properties of an anisotropic conductive film effectively even after it is maintained at a high temperature and a high humidity for a long time, and has excellent durability.
2) It has higher adhesion than that of the prior art stably.
3) It enables bonding by thermal curing at a temperature of 130° C. or less, particularly 100° C. or less.
4) It has excellent work efficiency due to high tackiness at the time of temporary bonding.

When the above base resin is mixed with a phosphoric acid methacrylate and melamine-based resin, it can further improve adhesion between a resin such as polyimide or polyethylene terephthalate and a metal film.

Therefore, the shielded flat cable 10 produced by using the above conductive adhesive has excellent heat resistance and can ensure high connection reliability even in a high-temperature and high-humidity condition.

EXAMPLES

The following examples and comparative examples are provided for the purpose of further illustrating the present invention but are in no way to be taken as limiting.

Example 1

A shielding member having a 0.3 μm-thick copper deposition film formed thereon by a vacuum deposition method was formed on a 10 μm-thick PET film, a conductive adhesive prepared by dispersing nickel powders in a thermosetting adhesive shown in Table 1 below was dissolved in toluene, and the obtained solution was applied to the above copper deposition film to form a 20 μm-thick adhesive layer. The average particle diameter of the nickel powders dispersed in the above adhesive was 10 μm and the amount of the powders was 10 parts by weight based on 100 parts by weight of EVA as the main ingredient.

TABLE 1

| POLYMER | EVA | — |
|---|---|---|
| ORGANIC PEROXIDE | BENZOYL PEROXIDE | 4 phr |
| CROSSLINKING AID | PENTAERYTHRITOL TETRAACRYLATE | 5 phr |
| SILANE COUPLING AGENT | γ-AMINOPROPYL TRIETHOXYSILANE | 1 phr |

Meanwhile, six conductors each formed of a copper foil having a thickness of 0.1 mm and a width of 0.5 mm were arranged in parallel to one another at intervals of 1.25 mm and covered with a PET film except both end portions of the conductors to form a cable body. Thereafter, the above shielding member and the above cable body were joined together, heated at 130° C. for 1 minute and pressed at 1 MPa to be bonded together so as to produce a shielded flat cable.

A 90° peeling test (50 mm/min) was made on the obtained sample at normal temperature (25° C.) and a high temperature (85° C.) using a tensile tester to measure the adhesion of the sample. The results are shown in Table 2.

TABLE 2

|  | PRESENT INVENTION | PRIOR ART |
| --- | --- | --- |
| SHIELDING MEMBER | COPPER FOIL IS USED AS INSULATING FILM | SILVER FOIL IS USED AS INSULATING FILM |
| ADHESIVE RESIN | THERMOSETTING RESIN COMPRISING EVA AS BASE RESIN | THERMOPLASTIC RESIN COMPRISING SATURATED POLYESTER AS BASE RESIN |
| CONDUCTIVE PARTICLES | 10 PARTS BY WEIGHT OF Ni FILLER | 200 PARTS BY WEIGHT OF SILVER PARTICLES |
| ADHESION | 25° C.     1.2 kg/inch<br>80° C.     1.1 kg/inch | 1.1 kg/inch<br>0.2 kg/inch |

As a comparative example, a shielded flat cable was manufactured using a conductive adhesive prepared by dispersing silver particles in an adhesive resin comprising a saturated polyester which is a thermoplastic resin as the main component. The above test was made on this cable and the obtained results are shown in Table 2 as well.

As obvious from the results of Table 2, it is understood that the shielded flat cable of the present invention shows high adhesion at normal temperature and also at a high temperature, particularly at a high temperature, it has about 6 times higher adhesion than that of the prior art.

Example 2

A shielding member having a 0.3 $\mu$m-thick copper deposition film formed thereon by a vacuum deposition method was formed on a 10 $\mu$m-thick PET film, a conductive adhesive prepared by dispersing nickel powders in a thermosetting adhesive shown in Table 3 below was dissolved in toluene, and the obtained solution was applied to the above copper deposition film to form a 20 $\mu$m-thick adhesive layer. The average particle diameter of the nickel powders dispersed in the above adhesive was 10 $\mu$m and the amount of the powders was 10 parts by weight based on 100 parts by weight of PVB as the main ingredient.

TABLE 3

| POLYMER | PVB | — |
| --- | --- | --- |
| ORGANIC PEROXIDE | BENZOYL PEROXIDE | 4 phr |
| CROSSLINKING AID | NEOPENTYL GLYCOL DIMETHACRYLATE | 4 phr |
| SILANE COUPLING AGENT | γ-AMINOPROPYL TRIETHOXYSILANE | 1 phr |

Meanwhile, six conductors each formed of a copper foil having a thickness of 0.1 mm and a width of 0.5 mm were arranged in parallel to one another at intervals of 1.25 mm and covered with a PET film except both end portions of the conductors to form a cable body. Thereafter, the above shielding member and the above cable body were joined together, heated at 130° C. for 1 minute and pressed at 1 MPa to be bonded together so as to produce a shielded flat cable.

A 90° peeling test (50 mm/min) was made on the obtained sample at normal temperature (25° C.) and a high temperature (85° C.) using a tensile tester to measure the adhesion of the sample. The results are shown in Table 4.

TABLE 4

|  | PRESENT INVENTION | PRIOR ART |
| --- | --- | --- |
| SHIELDING MEMBER | COPPER FOIL IS USED AS INSULATING FILM | SILVER FOIL IS USED AS INSULATING FILM |
| ADHESIVE RESIN | THERMOSETTING RESIN COMPRISING PVB AS BASE RESIN | THERMOPLASTIC RESIN COMPRISING SATURATED POLYESTER AS BASE RESIN |
| CONDUCTIVE PARTICLES | 10 PARTS BY WEIGHT OF Ni FILLER | 200 PARTS BY WEIGHT OF SILVER PARTICLES |
| ADHESION | 25° C.     1.2 kg/inch<br>80° C.     1.1 kg/inch | 1.1 kg/inch<br>0.2 kg/inch |

As a comparative example, a shielded flat cable was manufactured using a conductive adhesive prepared by dispersing silver particles in an adhesive resin comprising a saturated polyester which is a thermoplastic resin as the main component. The above test was made on this cable and the obtained results are shown in Table 4 as well.

As obvious from the results of Table 4, it is understood that the shielded flat cable of the present invention shows high adhesion at normal temperature and also at a high temperature, particularly at a high temperature, it has about 5 times higher adhesion than that of the prior art.

Example 3

A shielding member having a 0.3 $\mu$m-thick copper deposition film formed thereon by a vacuum deposition method was formed on a 10 $\mu$m-thick PET film, a conductive adhesive prepared by dispersing nickel powders in a thermosetting adhesive shown in Table 5 below was dissolved in toluene, and the obtained solution was applied to the above copper deposition film to form a 20 $\mu$m-thick adhesive layer. The average particle diameter of the nickel powders dispersed in the above adhesive was 10 $\mu$m and the amount of the powders was 10 parts by weight based on 100 parts by weight of the saturated polyester as the main ingredient.

TABLE 5

| POLYMER | UNSATURATED POLYESTER | — |
| --- | --- | --- |
| ORGANIC PEROXIDE | BENZOYL PEROXIDE | 4 phr |
| CROSSLINKING AID | PENTAERYTHRITOL TETRAACRYLATE | 5 phr |
| SILANE COUPLING AGENT | γ-AMINOPROPYL TRIETHOXYSILANE | 1 phr |

Meanwhile, six conductors each formed of a copper foil having a thickness of 0.1 mm and a width of 0.5 mm were arranged in parallel to one another at intervals of 1.25 mm and covered with a PET film except both end portions of the conductors to form a cable body. Thereafter, the above shielding member and the above cable body were joined together, heated at 130° C. for 1 minute and pressed at 1 MPa to be bonded together so as to produce a shielded flat cable.

A 90° peeling test (50 mm/min) was made on the obtained sample at normal temperature (25° C.) and a high temperature (85° C.) using a tensile tester to measure the adhesion of the sample. The results are shown in Table 6.

TABLE 6

|  | PRESENT INVENTION | PRIOR ART |
| --- | --- | --- |
| SHIELDING MEMBER | COPPER FOIL IS USED AS INSULATING FILM | SILVER FOIL IS USED AS INSULATING FILM |
| ADHESIVE RESIN | THERMOSETTING RESIN COMPRISING UNSATURATED POLYESTER AS BASE RESIN | THERMOPLASTIC RESIN COMPRISING SATURATED POLYESTER AS BASE RESIN |
| CONDUCTIVE PARTICLES | 10 PARTS BY WEIGHT OF Ni FILLER | 200 PARTS BY WEIGHT OF SILVER PARTICLES |
| ADHESION | 25° C.   1.5 kg/inch<br>80° C.   1.2 kg/inch | 1.1 kg/inch<br>0.2 kg/inch |

As a comparative example, a shielded flat cable was manufactured using a conductive adhesive prepared by dispersing silver particles in an adhesive resin comprising a saturated polyester which is a thermoplastic resin as the main component. The above test was made on this cable and the obtained results are shown in Table 6 as well.

As obvious from the results of Table 6, it is understood that the shielded flat cable of the present invention shows high adhesion at normal temperature and also at a high temperature, particularly at a high temperature, it has about 6 times higher adhesion than that of the prior art.

While the above best mode of the present invention where a thermosetting adhesive is used as the adhesive has been described, even when an optically curable adhesive comprising a resin having heat resistance and flexibility after curing, such as EVA, PVB, acrylic resin or unsaturated polyester as the main component is used, the same effect can be obtained. When an optically curable resin is used, an optical sensitizer which generates a radical upon exposure to light is blended in place of the above-described organic peroxide which is a thermal curing agent. This optical sensitizer is preferably a radical photopolymerization initiator. Out of radical photopolymerization initiators, dehydrogenating initiators such as benzophenone, methyl o-benzoylbenzoate, 4-benzoyl-4'-methyldiphenyl sulfide, isopropylthioxanthone, diethylthioxanthone, ethyl 4-(diethylamino)benzoate may be used. Further, out of radical photopolymerization initiators, in-molecular cleavage initiators such as benzoin ether, benzoyl propyl ether, benzyl dimethyl ketal, α-hydroxyalkylphenones including 2-hydroxy-2-methyl-1-phenylpropan-1-one, 1-hydroxycyclohexylphenyl ketone, alkylphenyl glyoxylate and diethoxyacetophenone, α-aminoalkylphenones including 2-methyl-1-[4-(methylthio)phenyl]-2-morpholinopropanone-1 and 2-benzyl-2-dimethylamino-1-(4-morpholinophenyl)butanone-1, and acylphosphine oxide may also be used. These optical sensitizers may be used alone or in combination of two or more.

The optical sensitizer is preferably used in an amount of 0.1 to 10 parts by weight based on 100 parts by weight of the resin as the main component.

Examples of the light source used for optical curing include a mercury lamp, xenon lamp, halogen lamp, mercury halogen lamp, carbon arc lamp, incandescent lamp and laser which emit ultraviolet light to visible light. The exposure time which depends on the type of a lamp and the intensity of light is generally several tens of seconds to several tens of minutes.

In the above examples, the shielded flat cable 10 comprising five signal lines 22S and one ground line 22G has been described. The numbers and arrangement of the signal lines 22S and the ground lines 22G are not limited to these and suitably determined according to design specifications. The non-insulating portion 24 of the ground line 22G may be formed at not only one location but also multiple locations and may be formed continuous.

The shielding conductive layer 32 may be formed of a deposition film or sputtering film of gold, another metal or alloy.

INDUSTRIAL FEASIBILITY

As described above, since the shielded flat cable of the present invention comprises a conductive adhesive prepared by dispersing conductive particles in a thermally or optically curable adhesive comprising a base resin having heat resistance and flexibility after curing, such as EVA, PVB, acrylic resin or unsaturated polyester, as an adhesive used in an adhesive layer for bonding a cable body to a shielding member for sheathing this cable body, it has excellent heat resistance and ensures satisfactory connection reliability even in a high-temperature and high-humidity condition.

Adhesion can be further improved by blending a phosphoric acid methacrylate and melamine-based resin with the above base resin.

Since a nickel filler is used as the conductive particles, it is possible to ensure conductivity between the ground line of the cable body and a shielding conductive layer with an inexpensive material stably.

Since a flame retardant film is used as a substrate for the shielding member, the selection of materials for the shielding conductive layer is widened and the flame retardancy of the shielded flat cable can be improved.

What is claimed is:

1. A shielded flat cable comprising a cable body in which a plurality of conductors including at least one ground line is covered, except at least part of the ground line, with an insulating member, a shielding member having a shielding layer made of a conductive material formed on one side of an insulating substrate for sheathing the cable body, and an adhesive layer comprising an adhesive with conductive particles dispersed therein, part of the adhesive layer being in contact with a non-covered portion of the ground line for bonding the shielding member to the cable body, wherein the adhesive is a thermally or optically curable adhesive comprising a prime constituent mixed with a phosphoric acid methacrylate and melamine-based resin as a base resin, wherein said prime constituent is an ethylene-vinyl acetate copolymer or a copolymer of a monomer and at least one of ethylene and vinyl acetate.

2. The shielded flat cable of claim 1, wherein the phosphoric acid methacrylate is used in an amount of 0.1 to 60 parts by weight and the melamine-based resin is used in an amount of 0.1 to 200 parts by weight based on 100 parts by weight of the base resin.

3. The shielded flat cable of claim 1 wherein the phosphoric acid methacrylate is one or more of 2-methacryloyloxyethyl acid phosphate and diphenyl-2-methacryloyloxyethyl phosphate.

4. The shielded flat cable of claim 1, wherein the melamine-based resin is one or more of melamine resin, isobutylated melamine resin, butylated melamine resin and methylated melamine resin.

5. The shielded flat cable of claim 1, wherein the adhesive comprises an organic peroxide or optical sensitizer in an amount of 0.1 to 10 parts by weight based on 100 parts by weight of the base resin.

6. The shielded flat cable of claim 1, wherein the adhesive comprises at least one reactive compound selected from the group consisting of an acryloxy group-containing compound and methacryloxy group-containing compound in an amount of 0.5 to 80 parts by weight based on 100 parts by weight of the base resin.

7. The shielded flat cable of claim 1, wherein the adhesive comprises a silane coupling agent in an amount of 0.01 to 5 parts by weight based on 100 parts by weight of the base resin.

8. The shielded flat cable of claim 1, wherein the adhesive comprises a hydrocarbon resin in an amount of 1 to 200 parts by weight based on 100 parts by weight of the base resin.

9. A The shielded flat cable of claim 1, wherein the amount of the conductive particles is 1 to 70 parts by weight based on 100 parts by weight of the base resin.

10. The shielded flat cable of claim 1, wherein the average particle diameter of the conductive particles is 0.1 to 100 $\mu$m.

11. The shielded flat cable of claim 1, wherein a metal filler is used as the conductive particles.

12. The shielded flat cable of claim 11, wherein nickel powders are used as the metal filler.

13. The shielded flat cable of claim 1, wherein a flame retardant film is used as the substrate of the shielding member.

14. A shielded flat cable comprising a cable body in which a plurality of conductors including at least one ground line is covered, except at least part of the ground line, with an insulating member, a shielding member having a shielding layer made of a conductive material formed on one side of an insulating substrate for sheathing the cable body, and an adhesive layer comprising an adhesive with conductive particles dispersed therein, part of the adhesive layer being in contact with a non-covered portion of the ground line for bonding the shielding member to the cable body, wherein the adhesive is a thermally or optically curable adhesive comprising a prime constituent mixed with a phosphoric acid methacrylate and melamine-based resin as a base resin, wherein said prime constituent is a polymer obtained by acetalizing a polyvinyl alcohol.

15. The shielded flat cable of claim 14, wherein the content of the acetal group in the polymer is 30 mol % or more.

16. The shielded flat cable of claim 14, wherein the phosphoric acid methacrylate is used in an amount of 0.1 to 60 parts by weight and the melamine-based resin is used in an amount of 0.1 to 200 parts by weight based on 100 parts by weight of the base resin.

17. The shielded flat cable of claim 14 wherein the phosphoric acid methacrylate is one or more of 2-methacryloyloxyethyl acid phosphate and diphenyl-2-methacryloyloxyethyl phosphate.

18. The shielded flat cable of claim 14, wherein the melamine-based resin is one or more of melamine resin, isobutylated melamine resin, butylated melamine resin and methylated melamine resin.

19. The shielded flat cable of claim 14, wherein the adhesive comprises an organic peroxide or optical sensitizer in an amount of 0.1 to 10 parts by weight based on 100 parts by weight of the base resin.

20. The shielded flat cable of claim 14, wherein the adhesive comprises at least one reactive compound selected from the group consisting of an acryloxy group-containing compound and methacryloxy group-containing compound in an amount of 0.5 to 80 parts by weight based on 100 parts by weight of the base resin.

21. The shielded flat cable of claim 14, wherein the adhesive comprises a silane coupling agent in an amount of 0.01 to 5 parts by weight based on 100 parts by weight of the base resin.

22. The shielded flat cable of claim 14, wherein the adhesive comprises a hydrocarbon resin in an amount of 1 to 200 parts by weight based on 100 parts by weight of the base resin.

23. The shielded flat cable of claim 14, wherein the amount of the conductive particles is 1 to 70 parts by weight based on 100 parts by weight of the base resin.

24. The shielded flat cable of claim 14, wherein the average particle diameter of the conductive particles is 0.1 to 100 $\mu$m.

25. The shielded flat cable of claim 14, wherein a metal filler is used as the conductive particles.

26. The shielded flat cable of claim 25, wherein nickel powders are used as the metal filler.

27. The shielded flat cable of claim 14, wherein a flame retardant film is used as the substrate of the shielding member.

28. A shielded flat cable comprising a cable body in which a plurality of conductors including at least one ground line is covered, except at least part of the ground line, with an insulating member, a shielding member having a shielding layer made of a conductive material formed on one side of an insulating substrate for sheathing the cable body, and an adhesive layer comprising an adhesive with conductive particles dispersed therein, part of the adhesive layer being in contact with a non-covered portion of the ground line for bonding the shielding member to the cable body, wherein the adhesive is a thermally or optically curable adhesive comprising a prime constituent mixed with a phosphoric acid methacrylate and melamine-based resin as a base resin, wherein said crime constituent is a polymer obtained by acetalizing a polyvinyl alcohol, or an acrylic resin obtained by polymerizing at least one of an acrylic monomer and a methacrylic monomer.

29. The shielded flat cable of claim 28, wherein the phosphoric acid methacrylate is used in an amount of 0.1 to 60 parts by weight and the melamine-based resin is used in an amount of 0.1 to 200 parts by weight based on 100 parts by weight of the base resin.

30. The shielded flat cable of claim 28 wherein the phosphoric acid methacrylate is one or more of 2-methacryloyloxyethyl acid phosphate and diphenyl-2-methacryloyloxyethyl phosphate.

31. The shielded flat cable of claim 28, wherein the melamine-based resin is one or more of melamine resin, isobutylated melamine resin, butylated melamine resin and methylated melamine resin.

32. The shielded flat cable of claim 28, wherein the adhesive comprises an organic peroxide or optical sensitizer in an amount of 0.1 to 10 parts by weight based on 100 parts by weight of the base resin.

33. The shielded flat cable of claim 28, wherein the adhesive comprises at least one reactive compound selected from the group consisting of an acryloxy group-containing compound and methacryloxy group-containing compound in an amount of 0.5 to 80 parts by weight based on 100 parts by weight of the base resin.

34. The shielded flat cable of claim 28, wherein the adhesive comprises a silane coupling agent in an amount of 0.01 to 5 parts by weight based on 100 parts by weight of the base resin.

35. The shielded flat cable of claim 28, wherein the adhesive comprises a hydrocarbon resin in an amount of 1 to 200 parts by weight based on 100 parts by weight of the base resin.

36. The shielded flat cable of claim 28, wherein the amount of the conductive particles is 1 to 70 parts by weight based on 100 parts by weight of the base resin.

37. The shielded flat cable of claim 28, wherein the average particle diameter of the conductive particles is 0.1 to 100 μm.

38. The shielded flat cable of claim 28, wherein a metal filler is used as the conductive particles.

39. The shielded flat cable of claim 38, wherein nickel powders are used as the metal filler.

40. The shielded flat cable of claim 28, wherein a flame retardant film is used as the substrate of the shielding member.

41. A shielded flat cable comprising a cable body in which a plurality of conductors including at least one ground line is covered, except at least part of the ground line, with an insulating member, a shielding member having a shielding layer made of a conductive material formed on one side of an insulating substrate for sheathing the cable body, and an adhesive layer comprising an adhesive with conductive particles dispersed therein, part of the adhesive layer being in contact with a non-covered portion of the ground line for bonding the shielding member to the cable body, wherein the adhesive is a thermally or optically curable adhesive comprising a prime constituent mixed with a phosphoric acid methacrylate and melamine-based resin as a base resin, wherein said prime constituent is a polyester unsaturated compound soluble in a solvent.

42. The shielded flat cable of claim 41, wherein the phosphoric acid methacrylate is used in an amount of 0.1 to 60 parts by weight and the melamine-based resin is used in an amount of 0.1 to 200 parts by weight based on 100 parts by weight of the base resin.

43. The shielded flat cable of claim 41 wherein the phosphoric acid methacrylate is one or more of 2-methacryloyloxyethyl acid phosphate and diphenyl-2-methacryloyloxyethyl phosphate.

44. The shielded flat cable of claim 41, wherein the melamine-based resin is one or more of melamine resin, isobutylated melamine resin, butylated melamine resin and methylated melamine resin.

45. The shielded flat cable of claim 41, wherein the adhesive comprises an organic peroxide or optical sensitizer in an amount of 0.1 to 10 parts by weight based on 100 parts by weight of the base resin.

46. The shielded flat cable of claim 41, wherein the adhesive comprises at least one reactive compound selected from the group consisting of an acryloxy group-containing compound and methacryloxy group-containing compound in an amount of 0.5 to 80 parts by weight based on 100 parts by weight of the base resin.

47. The shielded flat cable of claim 41, wherein the adhesive comprises a silane coupling agent in an amount of 0.01 to 5 parts by weight based on 100 parts by weight of the base resin.

48. The shielded flat cable of claim 41, wherein the adhesive comprises a hydrocarbon resin in an amount of 1 to 200 parts by weight based on 100 parts by weight of the base resin.

49. The shielded flat cable of claim 41, wherein the amount of the conductive particles is 1 to 70 parts by weight based on 100 parts by weight of the base resin.

50. The shielded flat cable of claim 41, wherein the average particle diameter of the conductive particles is 0.1 to 100 μm.

51. The shielded flat cable of claim 41, wherein a metal filler is used as the conductive particles.

52. The shielded flat cable of claim 51, wherein nickel powders are used as the metal filler.

53. The shielded flat cable of claim 41, wherein a flame retardant film is used as the substrate of the shielding member.

* * * * *